(12) United States Patent
Yamada

(10) Patent No.: US 7,170,254 B2
(45) Date of Patent: Jan. 30, 2007

(54) STEPPER MOTOR DRIVING APPARATUS

(75) Inventor: Yoshihisa Yamada, Shimada (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/976,905

(22) Filed: Nov. 1, 2004

(65) Prior Publication Data
US 2005/0116678 A1  Jun. 2, 2005

(30) Foreign Application Priority Data
Oct. 31, 2003  (JP)  ............... P. 2003-372417

(51) Int. Cl.
*H02P 8/00*  (2006.01)
(52) U.S. Cl. .............. 318/696; 318/685; 318/434; 318/461; 318/474
(58) Field of Classification Search ........... 318/696
See application file for complete search history.

(56) References Cited

U.S. PATENT DOCUMENTS

| | | | |
|---|---|---|---|
| 5,032,781 A * | 7/1991 | Kronenberg | 318/696 |
| 5,333,371 A * | 8/1994 | Mittenbuhler et al. | 29/595 |
| 5,723,964 A * | 3/1998 | Nakaba | 318/599 |
| 5,847,531 A * | 12/1998 | Hoffsommer et al. | 318/696 |
| 5,869,776 A * | 2/1999 | Vuong et al. | 73/866.3 |
| 5,877,694 A * | 3/1999 | Kataoka | 340/688 |
| 6,014,075 A * | 1/2000 | Fujimori et al. | 340/461 |
| 6,111,380 A * | 8/2000 | Munz et al. | 318/474 |
| 6,150,782 A * | 11/2000 | Breitling et al. | 318/434 |
| 6,262,872 B1 * | 7/2001 | Messerli et al. | 361/93.2 |
| 6,282,498 B1 * | 8/2001 | Tamaki et al. | 702/44 |
| 6,400,543 B2 * | 6/2002 | Messerli et al. | 361/93.2 |
| 6,402,478 B1 * | 6/2002 | Zhang et al. | 417/63 |
| 6,476,580 B1 * | 11/2002 | Nakamiya et al. | 318/696 |
| 6,519,999 B2 * | 2/2003 | Komura et al. | 73/1.88 |
| 6,556,795 B2 * | 4/2003 | Miyamura et al. | 399/30 |
| 6,677,723 B2 * | 1/2004 | Shimazaki | 318/696 |
| 6,680,597 B1 * | 1/2004 | Catellani et al. | 318/696 |
| 6,731,092 B2 * | 5/2004 | Shimazaki | 318/685 |
| 6,741,058 B2 * | 5/2004 | Yamada et al. | 318/685 |
| 6,778,367 B1 * | 8/2004 | Grendene | 361/33 |
| 6,853,162 B2 * | 2/2005 | Betts et al. | 318/696 |

(Continued)

FOREIGN PATENT DOCUMENTS

WO  WO 97/37425 A1  10/1997

(Continued)

*Primary Examiner*—Lincoln Donovan
*Assistant Examiner*—Robert W. Horn
(74) *Attorney, Agent, or Firm*—Sughrue Mion, PLLC

(57) ABSTRACT

A stepper motor driving apparatus, includes a stepper motor; a driven member interlocked with a rotation of a rotor of the stepper motor, a stopper stopping the driven member in a zero position, a controller controlling the excitation state of an excitation coil of the stepper motor, an induced voltage waveform detector detecting an induced voltage waveform generated on the basis of change of magnetic flux in accordance with the rotation of the rotor, and a zero position detector detecting whether the driven member is stopped in the zero position. The zero position detector includes a comparator which compares a time T2 in which each induced voltage waveform exceeds a predetermined threshold value with a predetermined contact determining reference time Tref, and a determinant which determines whether the driven member is stopped in the zero position by the stopper based on a result of the comparison by the comparator.

4 Claims, 9 Drawing Sheets

U.S. PATENT DOCUMENTS

| | | | |
|---|---|---|---|
| 2002/0117988 A1* | 8/2002 | Komura | 318/696 |
| 2003/0094916 A1* | 5/2003 | Umehara et al. | 318/696 |
| 2004/0027089 A1* | 2/2004 | Forsey | 318/685 |
| 2004/0104701 A1* | 6/2004 | Ohshima | 318/445 |
| 2004/0108829 A1* | 6/2004 | Betts et al. | 318/696 |
| 2004/0189237 A1* | 9/2004 | Mamyoda | 318/685 |
| 2005/0024008 A1* | 2/2005 | Yamada | 318/685 |
| 2005/0083008 A1* | 4/2005 | Oishi | 318/696 |
| 2005/0093503 A1* | 5/2005 | Sasaki | 318/696 |
| 2005/0116678 A1* | 6/2005 | Yamada | 318/685 |
| 2006/0055360 A1* | 3/2006 | Reiter et al. | 318/696 |

FOREIGN PATENT DOCUMENTS

| WO | 01/01558 A1 | 1/2001 |
|---|---|---|

\* cited by examiner

STEPPER MOTOR DRIVING APPARATUS

BACKGROUND OF THE INVENTION

The present invention relates to a stepper motor driving apparatus and particularly to a stepper motor driving apparatus improved in a process of initializing a stepper motor used in an on-vehicle meter or the like.

For the reason of indication accuracy and cost, a stepper motor has been recently put into wide use in an on-vehicle meter such as a speed meter for indicating vehicle velocity or a tachometer for indicating the number of engine revolutions.

In a vehicle equipped with an on-vehicle meter using such a stepper motor, there is however a possibility that a difference between the required amount of movement of an indicating pointer interlocked with the rotation of the stepper motor and the actual amount of movement of the indicating pointer may be generated by a mistaken drive signal caused by vibration of the vehicle, noise, etc.

Therefore, in an on-vehicle meter using such a stepper motor, an initializing process is carried out so that the stepper motor is rotated backward in a stopper direction, for example, at switching-on timing of an ignition switch to restore the indicating pointer to a zero position decided by the stopper.

In the initializing process, whether the indicating pointer position-controlled by the stepper motor comes into contact with the stopper deciding the zero position of the indicating pointer is detected as follows. An induced voltage generated on the basis of change of magnetic flux in accordance with the rotation of a rotor of the stepper motor is detected. Zero position detection is performed so that when the detected induced voltage is not higher than a predetermined threshold, a decision is made that the indicating pointer has been stopped because of collision with the stopper disposed in the zero position.

For example, a stepper motor driving apparatus in which such zero position detection can be performed has been disclosed in International Patent Publication No. WO97/37425.

FIGS. 8 and 9 are block circuit diagrams of a related stepper motor driving apparatus disclosed in the WO97/37425. A stepper motor 10 includes four winding wires 1 to 4, and four switches 5 to 8 connected in series to the winding wires respectively. These winding wires 1 to 4 are connected between a positive supply potential UB, for example, of a car battery and a ground potential 0 by the switches 5 to 8 respectively. Tap terminals 11 to 14 are provided between the winding wires and the switches, respectively. The tap terminals 11 to 14 are used for monitoring voltages of the winding wires 1 to 4 respectively in order to specify a stopper and blocking. When the switches 5 to 8 are controlled to be opened or closed, the winding wires 1 to 4 included in the stepper motor 10 are connected to or disconnected from the supply potential UB. That is, the winding wires 1 to 4 are in a current conduction state or in a current non-conduction state.

In the stepper motor including the switches 5 to 8 disposed between the ground potential 0 and the winding wires 1 to 4 respectively as shown in FIG. 8, there is formed a stepper motor control portion having ground switches or low side drivers.

Next, in FIG. 9, an evaluation circuit 20 detects voltage peaks 51 and 52 of a voltage chart 50 induced in each current non-conduction winding wire as shown in FIG. 10. When the voltage peaks 51 and 52 are larger than a predetermined threshold, the evaluation circuit 20 specifies elastic blocking and generates a suitable output signal. The output signal serves as an external interrupt signal supplied to a microcontroller provided in a not-shown control circuit for controlling the stepper motor 10.

The voltage peaks 51 and 52 are different in polarity. This fact will be understood well when a zero line 53 shown in FIG. 10 is used as a reference line. The polarity can be measured appropriately by the evaluation circuit 20. More advantageously, detection can be executed even in the case where the stepper motor operates slowly because the stepper motor is out of order. The evaluation circuit need not have a high time sensitivity. Accordingly, inexpensive constituent elements can be used.

The evaluation circuit 20 shown in FIG. 9 has four branch paths which are the same in configuration and which correspond to the four winding tap terminals 11 to 14 shown in FIG. 8. Comparators 21 corresponding to the winding wires are provided in the branch paths respectively so as to be independent of one another. Each of the comparators 21 has a noninverting input terminal designated by "+", and an inverting input terminal designated by "−". The inverting input terminal of each comparator 21 is connected to a predetermined potential through a voltage divider which is composed of resistors 22 and 23 and which is connected between the supply potential UB and the ground potential 0. The noninverting input terminal of each comparator 21 is connected to a predetermined potential through a voltage divider which is composed of resistors 24 and 25 and which is connected between the supply potential UB and the ground potential 0. A series circuit composed of a diode 26 and a capacitor 27 is connected between each of the input terminals 11 to 14 of the evaluation circuit 20 and the noninverting input terminal of corresponding one of the comparators 21. The polarity of each diode 26 is decided as follows. That is, the polarity of each diode 26 is decided so that only a negative voltage, e.g. a voltage peak 52 shown in FIG. 10 can reach the noninverting input terminal "+" of a corresponding comparator 21 through a corresponding capacitor 27.

A threshold for the comparator 21 is decided in the inverting input terminal "−" by the voltage divider composed of the resistors 22 and 23. The voltage divider composed of the resistors 24 and 25 is provided so that only the voltage peak 52 exceeding a predetermined potential can reach the noninverting input terminal. The voltage in the inverting input terminal of the comparator 21 is decided by the voltage divider composed of the resistors 22 and 23 so that the voltage is lower than the voltage in the noninverting input terminal. Only the negative voltage is input and coupled to the noninverting input terminal of the comparator 21 by the diode 26 while only the edge of the negative voltage is input and coupled to the noninverting input terminal by the capacitor 27. The resistance ratio at a tap of the voltage divider composed of the resistors 22 and 23 is set to be equal to the resistance ratio at a tap of the voltage divider composed of the resistors 24 and 25. Accordingly, even in the case where the supply potential UB fluctuates, a signal output from the comparator 21 does not depend on the fluctuation of the supply potential UB because the two voltage dividers can lead the fluctuation of the supply potential UB in the same ratio.

The comparators 21 have output terminals 28 respectively. The output terminals 28 are led to an output terminal 200 common to all the comparators 21 through negatively polarized diodes 29 respectively. The common output terminal 200 is further connected to a reference voltage source Uref through a resistor 201 and connected to the ground potential 0 through a capacitor 202. As described above, when the voltage peak 52 of the voltage chart 50 induced in a current non-conduction winding wire exceeds a reference value, that is, when elastic blocking is specified, a signal is generated at the common output terminal 200. The output signal generated at the common output terminal 200 for designating blocking is supplied as an external interrupt signal to the micro-controller in the control circuit of the stepper motor. In the micro-controller, the output signal is further processed appropriately.

The fact that a reversed phase voltage is induced in a current non-conduction winding wire when an armature rotates backward is used in the evaluation for specifying elastic blocking. This voltage in the noninverting input terminal of at least one of the comparators 21 is lower than the voltage in the inverting input terminal. As a result, the output of the comparator 21 is switched. Accordingly, an interrupt is triggered so that blocking of the stepper motor is specified. On the contrary, when the stepper motor is operating, the voltage in the noninverting input terminal of the comparator 21 is kept higher than the voltage in the inverting input terminal.

SUMMARY OF THE INVENTION

In the above related stepper motor driving apparatus, however, the fact that a reversed phase voltage is induced in a current non-conduction wiring wire when an armature rotates backward is used in the evaluation for specifying elastic blocking (i.e. detecting the zero position).

For this reason, when the stepper motor driving apparatus is applied to an on-vehicle meter, the indicating pointer attached to the rotation shaft of the stepper motor stops in a position far from the stopper because of the backward rotation of the armature after the indicating pointer comes into contact with the stopper. Accordingly, there is a problem of accuracy in the meter because the indicating pointer cannot be set in the zero position accurately. Moreover, the indicating pointer behaves intensively because of the retreat (backward rotation) of the indicating pointer, so that the behavior of the indicating pointer looks unattractive. It is therefore necessary to detect the induced voltage before the backward rotation.

Therefore, an object of the invention is to provide a stepper motor driving apparatus in which the zero position can be detected more accurately in consideration of the above problem in the background art.

(1) The invention provides a stepper motor driving apparatus including:
   a stepper motor, which includes an excitation coil, and a rotor rotating in accordance with change of excitation state of the excitation coil;
   a driven member, which is interlocked with the rotation of the rotor;
   a stopper, which mechanically stops the driven member in a zero position;
   a controller, which controls the excitation state of the excitation coil;
   an induced voltage waveform detector, which detects an induced voltage waveform generated on the basis of change of magnetic flux in accordance with the rotation of the rotor; and
   a zero position detector, which detects whether the driven member is stopped in the zero position by the stopper or not, on the basis of the induced voltage waveform detected by the induced voltage waveform detector,
   wherein the zero position detector includes:
      a comparator, which compares a time T2 in which each induced voltage waveform exceeds a predetermined threshold value with a predetermined contact determining reference time Tref; and
      a determinant, which determines whether or not the driven member is stopped in the zero position by the stopper based on a result of the comparison by the comparator.

(2) The invention provides a stepper motor driving apparatus described in the paragraph (1), wherein the threshold value is set so that change of the time T2 in which the induced voltage waveform exceeds the predetermined threshold value is minimized with respect to temperature change in a specific temperature range.

(3) The invention provides a stepper motor driving apparatus including:
   a stepper motor, which includes an excitation coil, and a rotor rotating in accordance with change of excitation state of the excitation coil;
   a driven member, which is interlocked with the rotation of the rotor;
   a stopper, which mechanically stops the driven member in a zero position;
   a controller, which controls the excitation state of the excitation coil;
   an induced voltage waveform detector, which detects an induced voltage waveform generated on the basis of change of magnetic flux in accordance with the rotation of the rotor; and
   a zero position detector, which detects whether the driven member is stopped in the zero position by the stopper or not, on the basis of the induced voltage waveform detected by the induced voltage waveform detector,
   wherein the zero position detector includes:
      a comparator, which compares the number of sampling cycles in which each induced voltage waveform sampled in predetermined sampling timing in a predetermined sampling time exceeds a predetermined threshold value with a predetermined contact determining reference number; and
      a determinant, which determines whether or not the driven member is stopped in the zero position by the stopper based on a result of the comparison by the comparator.

(4) The invention provides a stepper motor driving apparatus described in the paragraph (3), wherein the threshold value is set so that change of the number of sampling cycles in which the induced voltage waveform sampled in predetermined sampling timing in a predetermined sampling time exceeds the predetermined threshold value is minimized with respect to temperature change in a specific temperature range.

According to the invention as in the paragraph (1), the zero position can be detected more accurately because the time in which the induced voltage waveform exceeds a threshold is monitored without use of the fact that a reversed phase voltage is induced in a current non-conduction winding wire when an armature rotates backward as in the related art.

According to the invention as in the paragraph (2), the zero position can be detected surely because the influence of temperature change can be avoided.

According to the invention as in the paragraph (3), the zero position can be detected more accurately because the number of sampling cycles in which the induced voltage waveform sampled in predetermined sampling timing in a predetermined sampling time exceeds a predetermined threshold is monitored without use of the fact that a reversed phase voltage is induced in a current non-conduction winding wire when an armature rotates backward as in the related art.

According to the invention as in the paragraph (4), the zero position can be detected surely because the influence of temperature change can be avoided.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
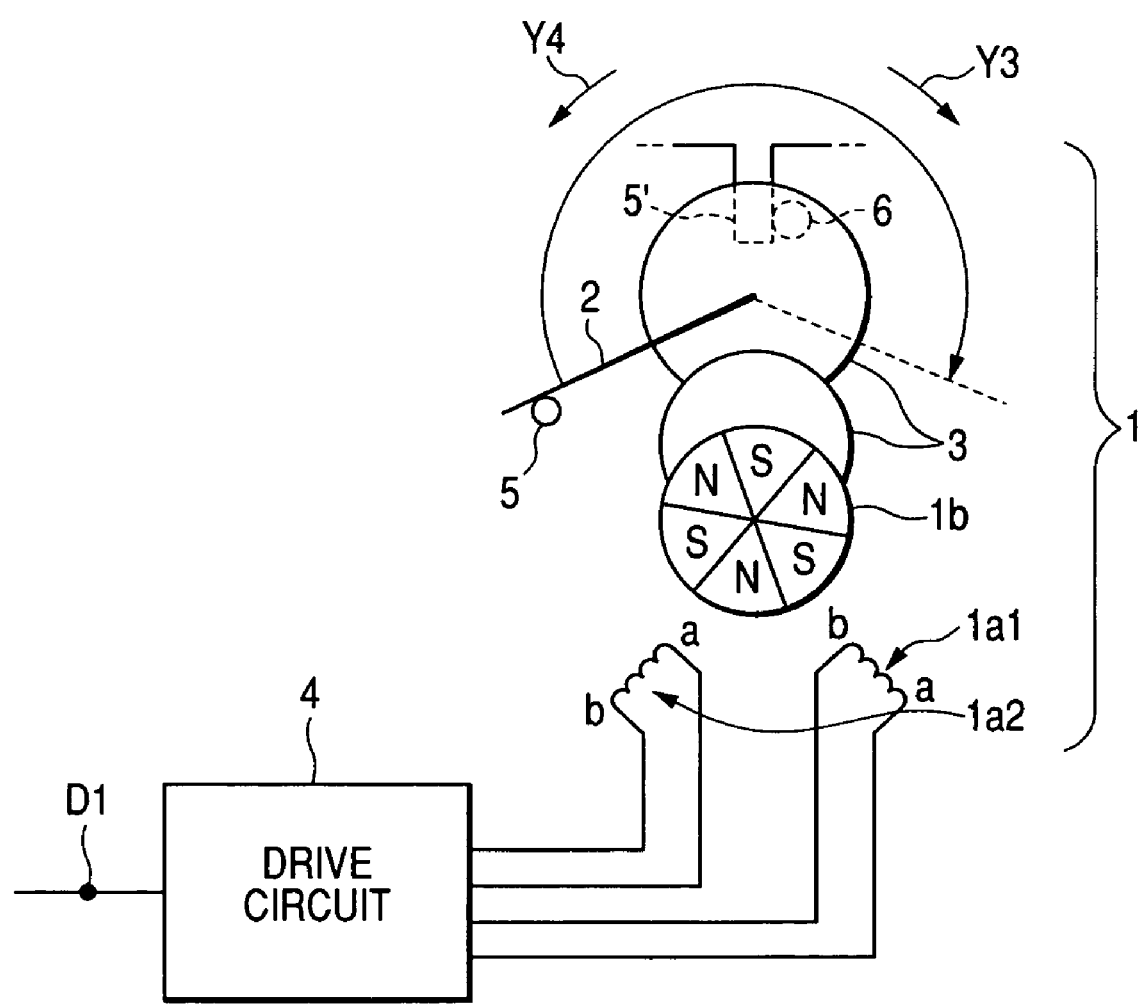
FIG. 1 is a configuration view of an on-vehicle meter using an embodiment of a stepper motor driving apparatus according to the invention.

FIG. 1 is a configuration view of an on-vehicle meter using an embodiment of a stepper motor driving apparatus according to the invention. For example, the on-vehicle meter is a speed meter which has a stepper motor 1, and a drive circuit 4 for performing the drive control of the stepper motor 1. The stepper motor 1 includes two excitation coils 1a1 and 1a2 disposed on a stator (not shown) so as to be perpendicular to each other, and a rotor 1b which is magnetized so that three N poles and three S poles are arranged alternately and which rotates in accordance with change in excitation state of the excitation coils 1a1 and 1a2.

The on-vehicle meter further has an indicating pointer 2 provided as a driven member interlocked with the rotation drive of the rotor 1b, gears 3 for transmitting the rotation drive of the rotor 1b to the indicating pointer 2, and a stopper 5 for stopping the indicating pointer 2 in a zero position by contacting the indicating pointer 2 mechanically. Incidentally, the zero position setting based on contact between the stopper 5 and the indicating pointer 2 may be replaced by a zero position setting based on contact between a stopper piece 6 as a driven member protruded from one of the gears 3 and a stopper 5' provided separately in a position corresponding to the zero position.

Figure 2:
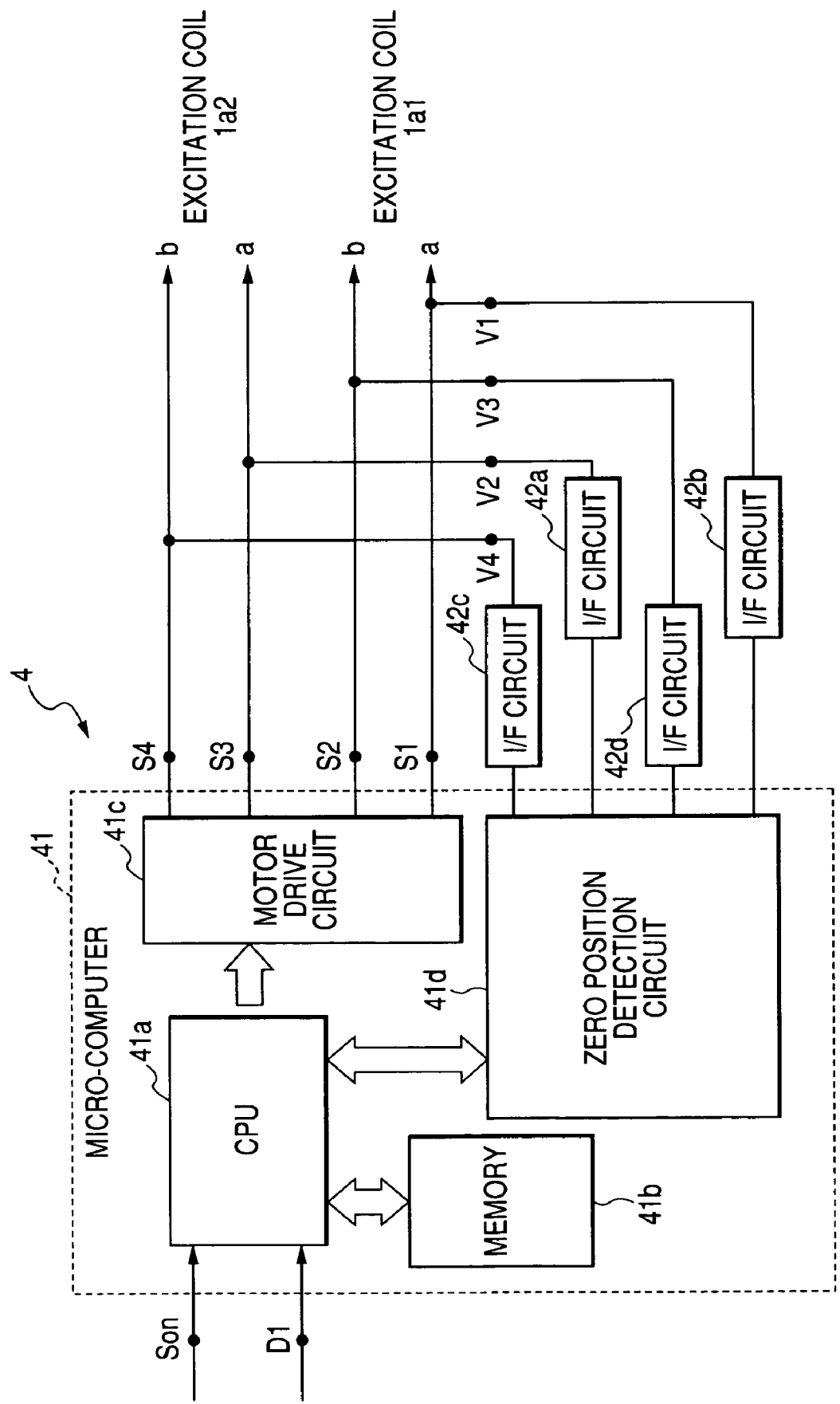
FIG. 2 is a diagram showing the configuration of the driving apparatus in the on-vehicle meter depicted in FIG. 1.

As shown in FIG. 2, the drive circuit 4 includes a micro-computer 41 as a controller. The micro-computer 41 has a central processing unit (CPU) 41a for performing various kinds of processes in accordance with programs, a memory 41b, a motor drive circuit 41c, and a zero position detection circuit 41d.

An angular data signal D1 calculated on the basis of velocity information given from a vehicle velocity sensor (not shown) and an initialization command signal Son of a high level based on an ignition-on operation of an ignition switch (not shown) are input to the CPU 41a. Excitation signals S1, S2, S3 and S4 are output from the motor drive circuit 41c so as to be supplied to respective opposite ends a and b of the excitation coils 1a1 and 1a2.

Induced voltage waveforms V1, V2, V3 and V4 are input to the zero position detection circuit 41d through interface (I/F) circuits 42a, 42b, 42c and 42d respectively. The I/F circuits 42a to 42d are connected to the respective ends a and b of the excitation coils 1a1 and 1a2. The zero position detection circuit 41d supplies a zero position judgment signal to the CPU 41a.

In an ordinary operating mode, the CPU 41a generates a first excitation pattern in accordance with the angular data signal D1 by a micro-stepping drive method so that one electrical cycle is formed by a plurality of excitation steps for rotating the rotor 1b forward and backward, and supplies the first excitation pattern to the excitation coils 1a1 and 1a2 to control the excitation state of the excitation coils 1a1 and 1a2 to thereby drive the stepper motor 1 to rotate the rotor 1b in a forward direction (Y2) or a backward direction (Y1) in accordance with the angular data signal D1. During the initializing process, the CPU 41a generates a second excitation pattern in accordance with the initialization command signal S1 in such manner that the plurality of excitation steps in the first excitation pattern are partially converted into excitation steps for detecting induced voltage waveforms, and supplies the second excitation pattern to the excitation coils 1a1 and 1a2 to thereby drive the stepper motor 1 to rotate the rotor 1b in the backward direction (i.e. Y1 direction) in which the indicating pointer 2 moves toward the stopper 5.

The micro-stepping drive method uses 1/n(n≧3) micro-stepping. For example, in this embodiment, micro-stepping for dividing one electrical cycle into 64 steps is used so that an electrical angle of 90 degrees is divided into 16 steps.

Figure 3:
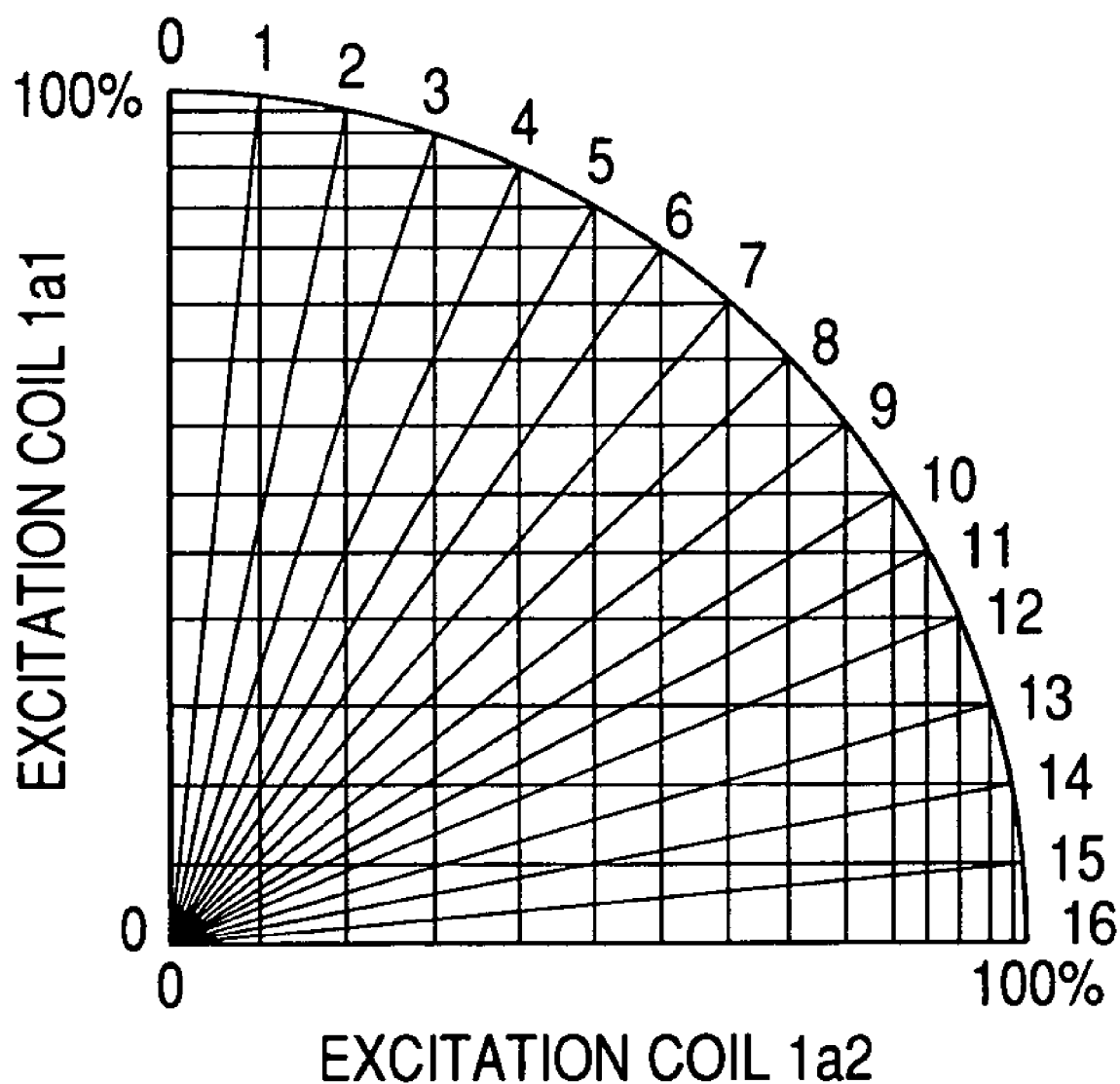
FIG. 3 is a current vector graph of an excitation signal in an ordinary operating mode.

FIG. 3 is a current vector graph of an excitation signal in an ordinary operating mode. FIG. 3 shows an example of current vectors in an angle of 90 degrees corresponding to excitation steps 0 to 16 in one electrical cycle.

Figure 4:
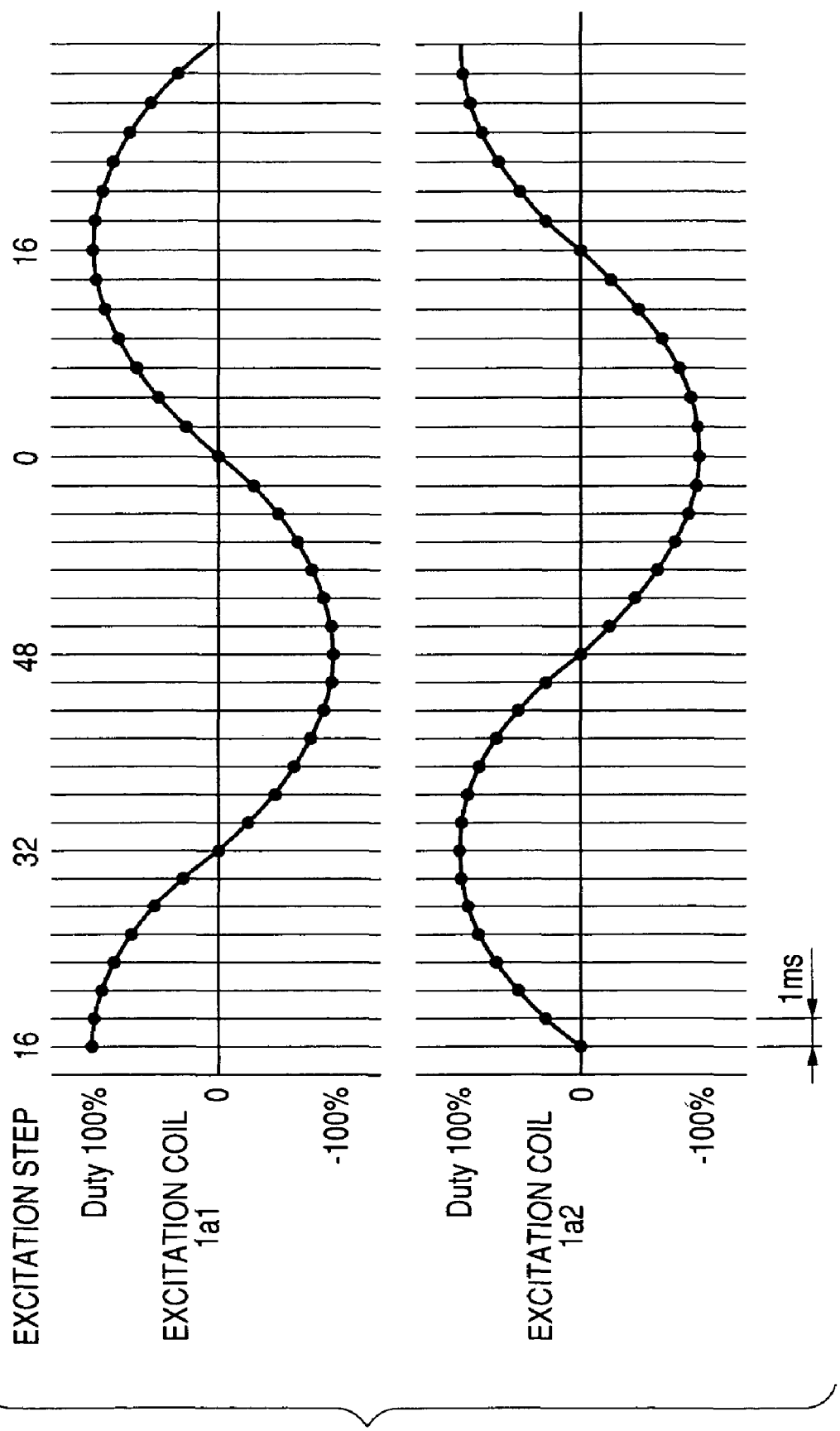
FIG. 4 is a waveform graph showing time-series current vectors of an excitation signal supplied to each excitation coil in a micro-stepping drive method in an ordinary operating mode.

FIG. 4 is a waveform graph showing time-series current vectors of an excitation signal supplied to the excitation coils 1a1 and 1a2 in the micro-stepping drive method in an ordinary operating mode. As shown in FIG. 4, in the ordinary operating mode, an excitation signal PWM-controlled so that the duty ratio increases or decreases stepwise in a range of from 0% to 100% is supplied to each of the excitation coils 1a1 and 1a2.

During the initializing process, induced voltage waveforms V1, V2, V3 and V4 generated at the respective opposite ends of the excitation coils 1a1 and 1a2 in a non-excitation state in which one end is opened are input to the zero position detection circuit 41d through the I/F circuits respectively in accordance with the detection timing signal. When the time or the number of sampling cycles in which any one of the input induced voltage waveforms V1, V2, V3 and V4 is not larger than a threshold is not larger than a predetermined value, the zero position detection circuit 41d generates a zero position judgment signal for judging that the indicating pointer 2 has come into contact with the stopper 5 in the zero position, and supplies the zero position judgment signal to the CPU 41a. That is, when one end of each of the excitation coils 1a1 and 1a2 is opened, the excitation coils 1a1 and 1a2 serve as elements for detecting induced voltage waveforms.

Next, the operation of the on-vehicle meter configured as described above will be described below with reference to FIG. 5 which is a flow chart showing a procedure for the zero position detection process executed by the CPU 41a and the zero position detection circuit 41d. When the initializing process starts, the excitation step is updated at regular update intervals (step S1). Then, a judgment is made as to whether backward rotation has reached the induced voltage waveform detection excitation inversion step or not (step S2). When backward rotation has reached the excitation inversion step, the induced voltage waveform detection process starts (step S3).

Then, the induced voltage waveform measuring coils are changed from a drive output to a Hi-Z output (high impedance output) in accordance with the detection timing signal (step S4). The term "Hi-Z output" means a state in which one end of each of excitation coils equivalent to the induced voltage waveform measuring coils is opened during a sampling time (e.g. 3 ms in this embodiment) based on the induced voltage waveform detection excitation step so that the excitation coils are not excited so that induced voltages are output from the excitation coils during the sampling time.

The waveforms of the induced voltages generated from the induced voltage waveform measuring coils during the sampling time (T1) based on the induced voltage waveform detection excitation step are sampled by several times at predetermined sampling timing intervals (step S5). That is, the induced voltage waveforms V1, V2, V3 and V4 generated at the respective opposite ends of the excitation coils 1a1 and 1a2 are sampled through the I/F circuits respectively and input to the zero position detection circuit 41d.

Then, a judgment is made as to whether a time (T2) in which each induced voltage waveform sampled during the sampling time T1 exceeds a threshold is shorter than a predetermined reference time (Tref) (i.e. T2<Tref) or not (step S6).

That is, when the time T2 in which each induced voltage waveform sampled during the sampling time T1 exceeds a threshold (Vref) is not shorter than the reference time Tref, a decision is made that the indicating pointer 2 has not come into contact with the stopper 5 yet and is rotating. When the time T2 is shorter than the reference time Tref, a decision is made that the indicating pointer 2 has already come into contact with the stopper 5.

Figure 6A:
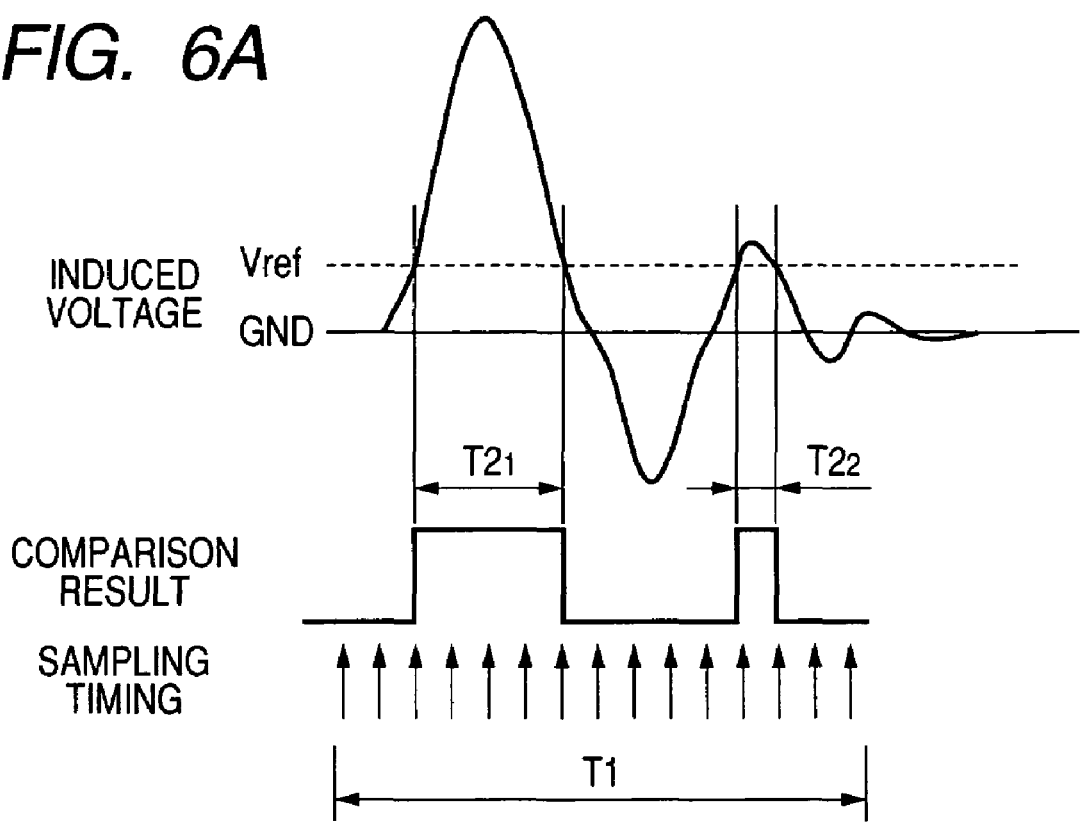
FIGS. 6A and 6B are views for explaining a principle of judgment as to whether an indicating pointer is in contact with a stopper or not.
Figure 6B:
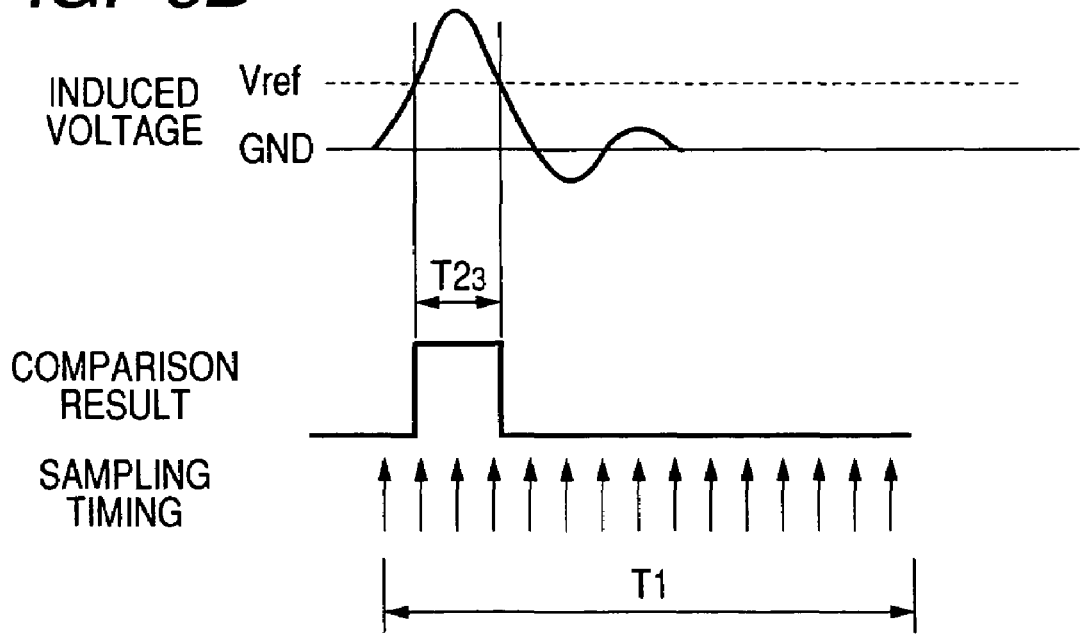

FIGS. 6A and 6B are views for explaining a principle of the judgment as to whether the indicating pointer 2 has come into contact with the stopper 5 or not. FIGS. 6A and 6B show the relations among the induced voltage, the result of comparison between the induced voltage value and the threshold Vref and the sampling timing in the sampling time T1 in the case where the sampling time T1 is long. FIG. 6A shows a state in which the indicating pointer 2 is rotating. FIG. 6B shows a state in which the indicating pointer 2 has come into contact with the stopper 5.

In the rotating state shown in FIG. 6A, sampling is performed by 15 times at predetermined sampling timing intervals during the sampling time T1. As a result of comparison between the induced voltage value and the threshold Vref, it is found that, in 7 sampling cycles among the 15 sampling cycles, the induced voltage value exceeds the threshold Vref. That is, in the third to seventh sampling cycles and the twelfth and thirteenth sampling cycles, that is, in 7 sampling cycles in total, in a period of from the start of the sampling time T1 to the end of the sampling time T1, the induced voltage value exceeds the threshold Vref. A result of comparison between the induced voltage value and the threshold Vref is expressed as a high level signal having two pulses with time widths $T2_1$ and $T2_2$. The time T2 in which the sampled induced voltage value exceeds the threshold Vref is given as the sum of the time widths $T2_1$ and $T2_2$ of the high level signal ($T2=T2_1+T2_2$).

In the contact state shown in FIG. 6B, the amplitude of the induced voltage becomes smaller than that in the rotating state. Accordingly, as a result of comparison between the induced voltage value and the threshold Vref during the sampling time T1, it is found that, in 3 sampling cycles among the 15 sampling cycles, the induced voltage value exceeds the threshold Vref. That is, in the second to fourth sampling cycles, that is, in 3 sampling cycles in total, in a period of from the start of the sampling time T1 to the end of the sampling time T1, the induced voltage value exceeds the threshold Vref. A result of comparison between the induced voltage value and the threshold Vref is expressed as a high level signal having one pulse with a time width $T2_3$. The time T2 in which the sampled induced voltage value exceeds the threshold Vref is given as the time width $T2_3$ of the high level signal ($T2=T2_3$).

Therefore, when, for example, the criterional reference time Tref is set to have a value corresponding to four sampling cycles in advance, the time T2 based on the comparison result shown in FIG. 6A is longer than the criterional reference time Tref to make it possible to decide that the indicating pointer 2 has not come into contact with the stopper 5 and is rotating whereas the time T2 based on the comparison result shown in FIG. 6B is shorter than the criterional reference time Tref to make it possible to decide that the indicating pointer 2 has already come into contact with the stopper 5.

Figure 5:
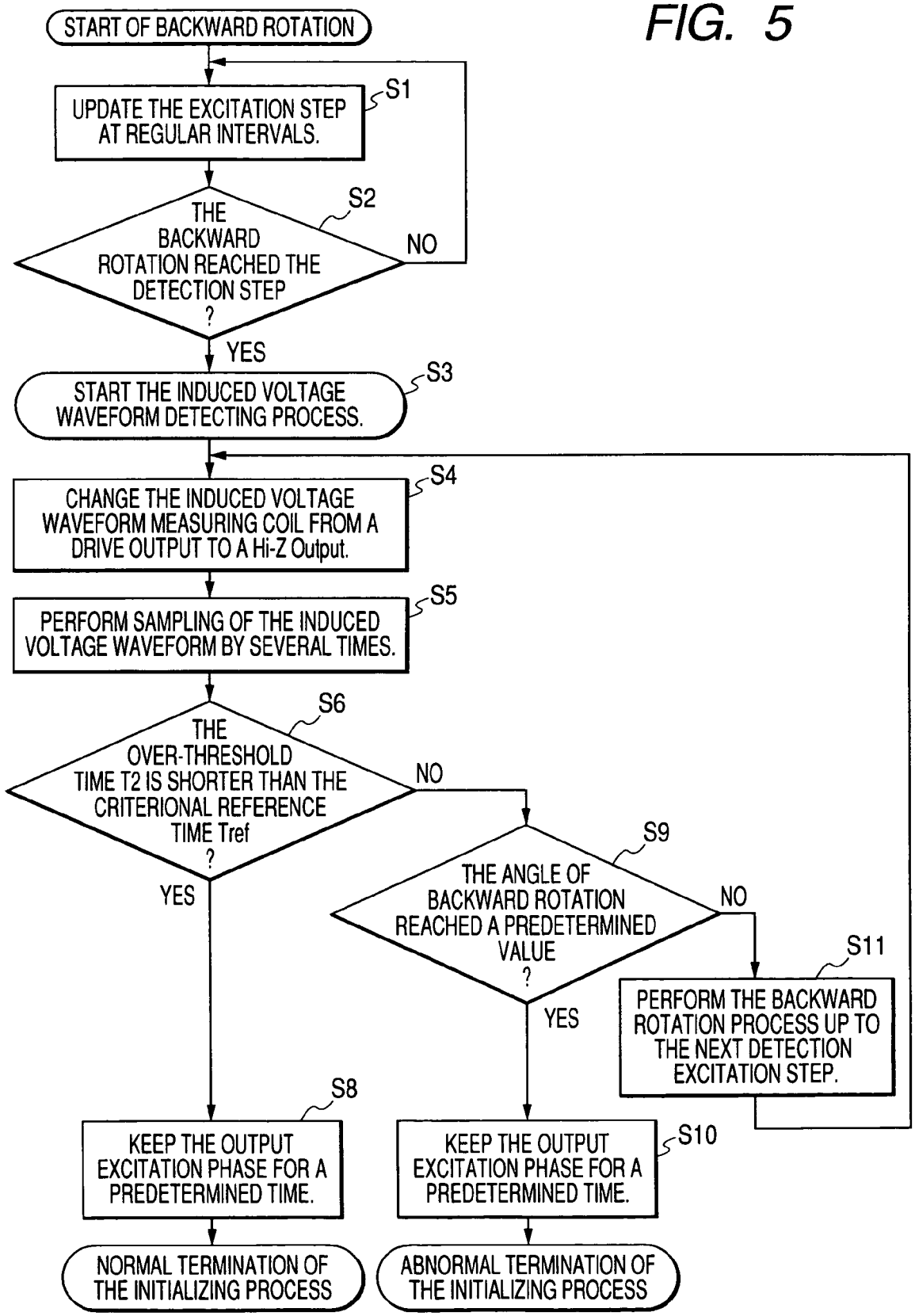
FIG. 5 is a flow chart showing a procedure of processing executed by a CPU of the drive circuit.

Referring back to the flow chart of FIG. 5, when the step S6 results in "YES", the output excitation phase is kept for a predetermined time (step S8) and then the initializing process is terminated normally.

On the other hand, when the step S6 results in "NO", a judgment is made as to whether the rotor 1b has rotated by a predetermined angle or not (step S9). When the step S9 results in "YES", the output excitation phase is kept for a predetermined time (step S10) and then the initializing process is terminated abnormally. When the step S9 results in "NO", the backward rotation process is executed up to the next detection excitation step in a micro-stepping manner (step S11) and then the current position of the routine goes back to the step S4.

As described above, unlike the related apparatus, the fact that a reversed phase voltage is induced in a current non-conduction winding wire when an armature rotates backward is not used in the invention. In the invention, a judgment is made as to whether the time T2 in which the sampled induced voltage waveform exceeds the threshold Vref is shorter than the predetermined criterional reference time Tref or not. When the time T2 in which the sampled induced voltage waveform exceeds the threshold Vref is not shorter than the criterional reference time Tref, a decision is made that the indicating pointer 2 has not come into contact with the stopper 5 yet and is rotating. When the time T2 is shorter than the criterional reference time Tref, a decision is made that the indicating pointer 2 has already come into contact with the stopper 5. Accordingly, the zero position can be detected more accurately.

Although an embodiment of the invention has been described above, the invention is not limited thereto and various changes and modifications may be made.

For example, the threshold Vref in the above embodiment may be set so that the influence of temperature change can be eliminated as sufficiently as possible.

Figure 7:
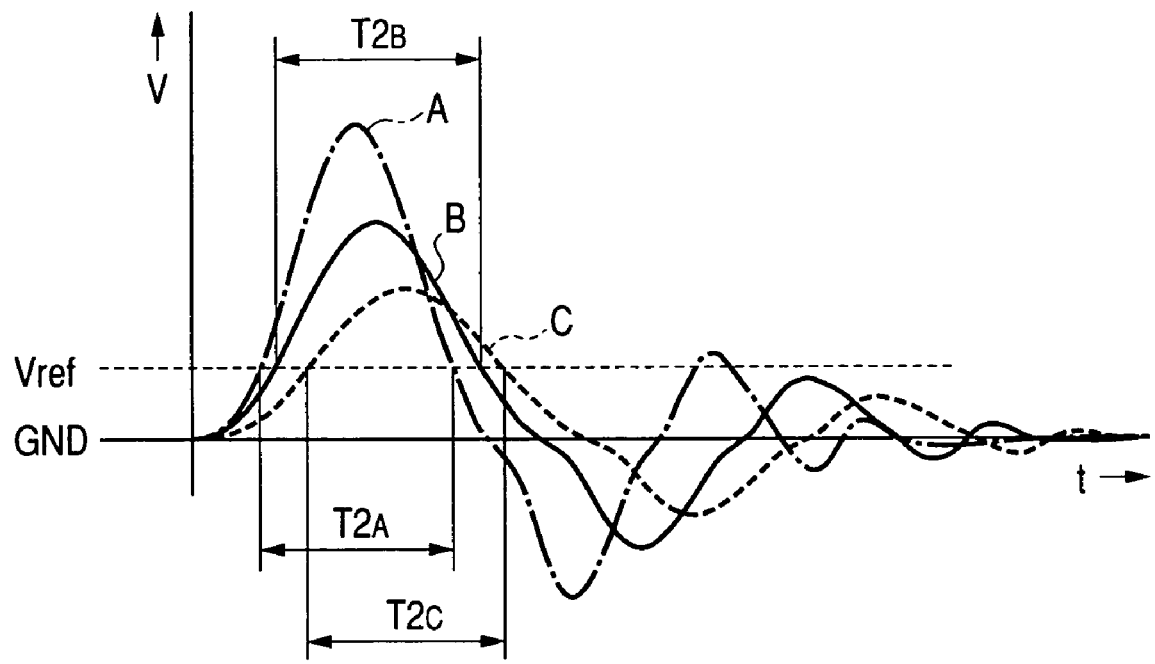
FIG. 7 is a view for explaining another method for setting the threshold.
Figure 8:
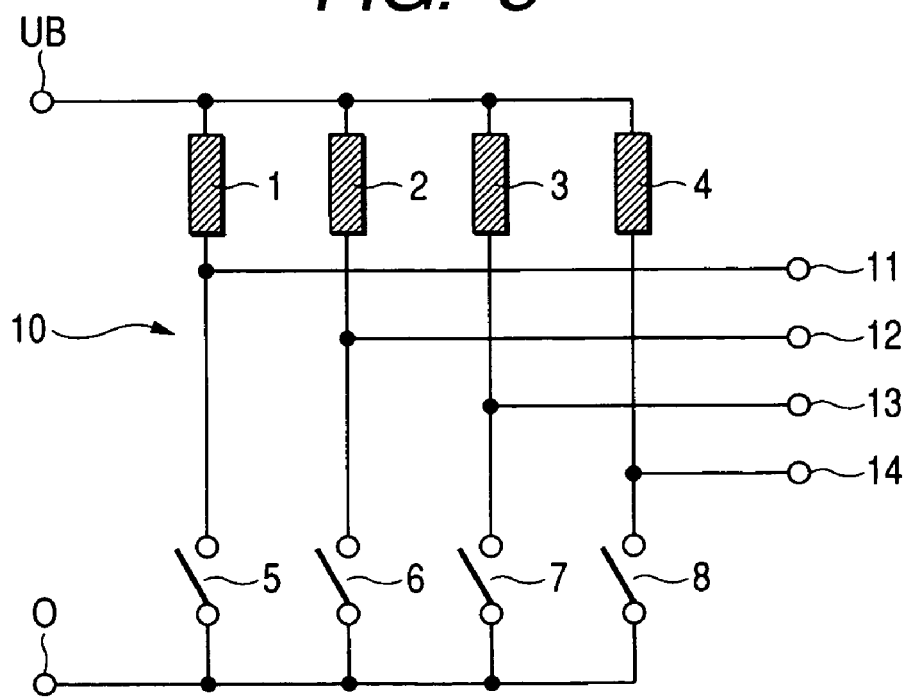
FIG. 8 is a block circuit diagram of a related stepper motor driving apparatus.
Figure 9:
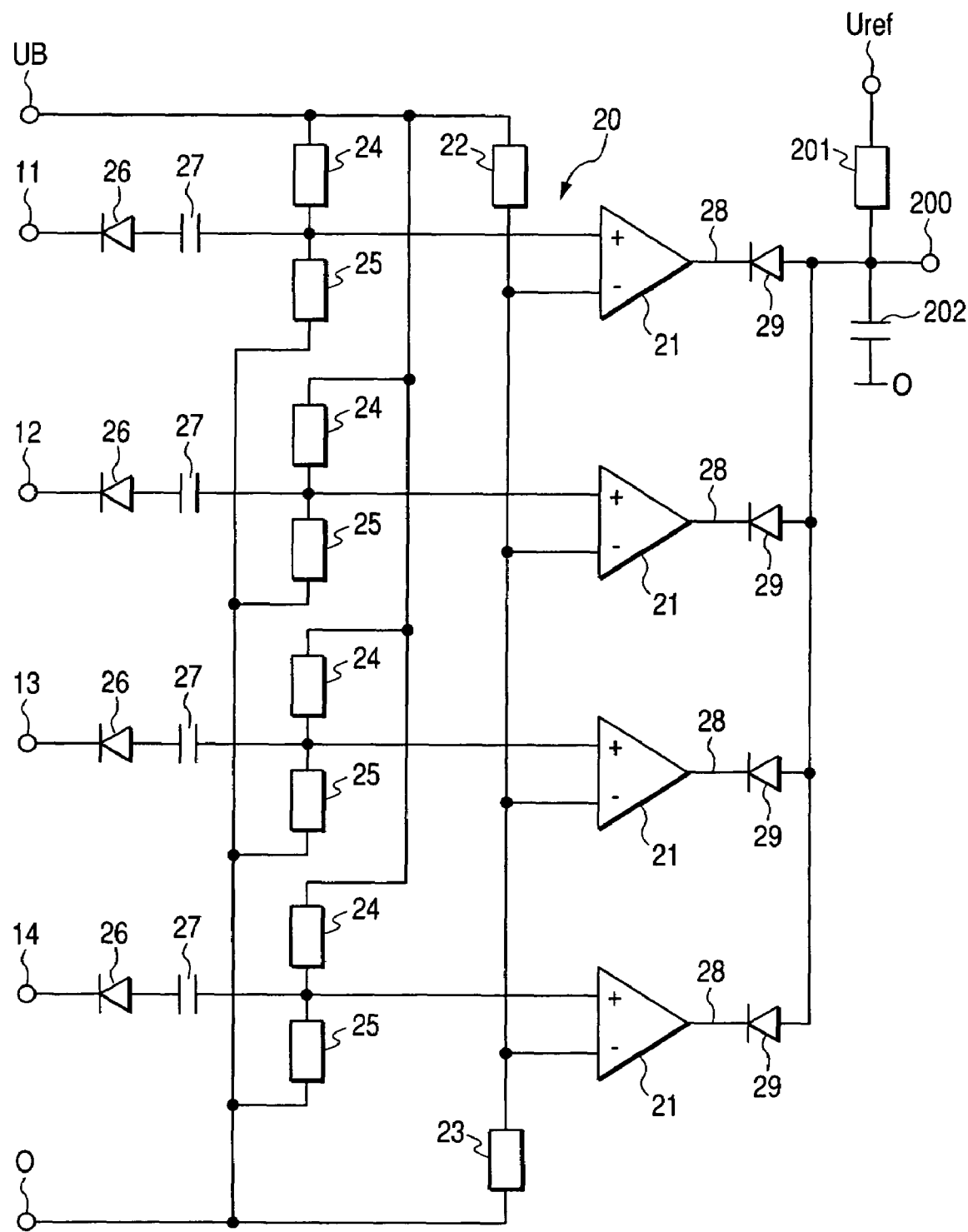
FIG. 9 is a block circuit diagram of an evaluation circuit in the driving apparatus depicted in FIG. 8.
Figure 10:
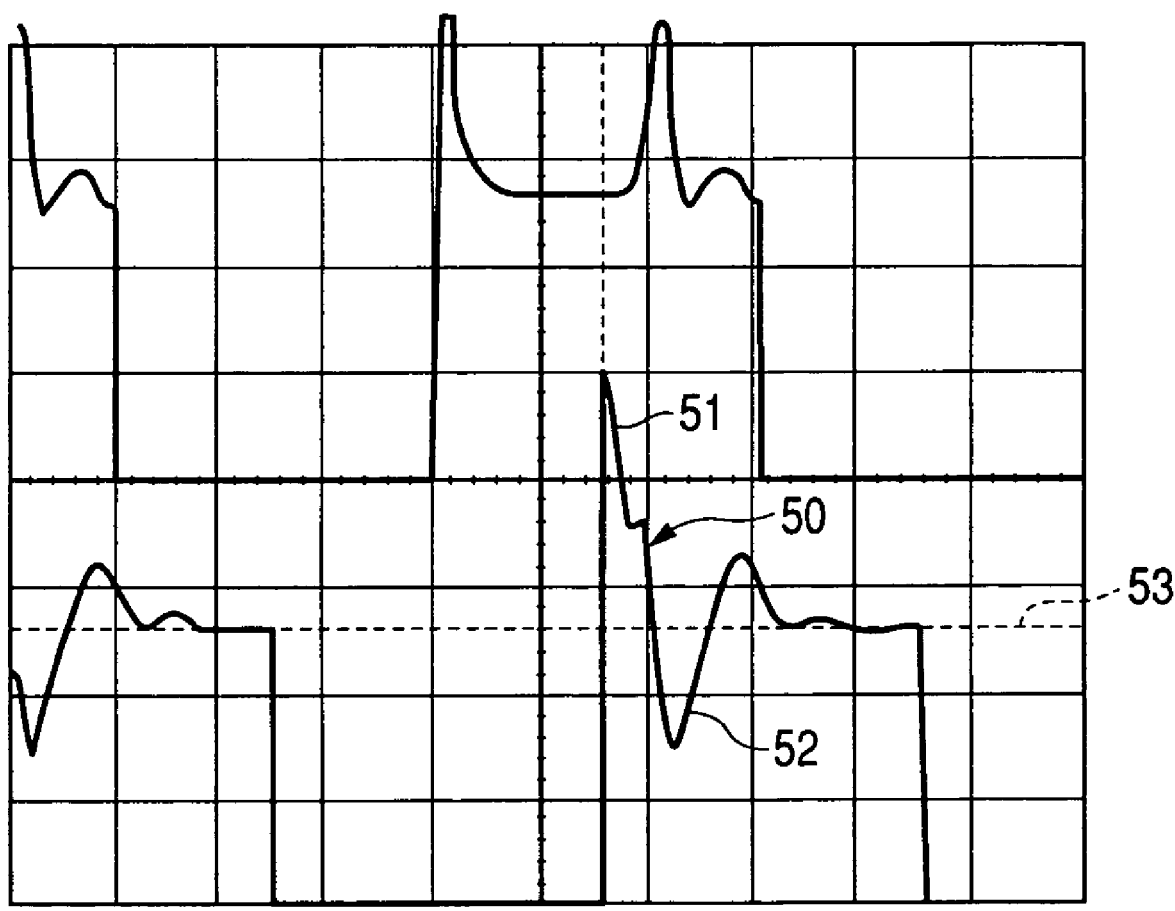
FIG. 10 is a graph showing voltage change in a current non-conduction winding wire in the driving apparatus depicted in FIGS. 8 and 9.

FIG. 7 is a view for explaining change of an induced voltage waveform in accordance with temperature change. In FIG. 7, the curves A, B and C show induced voltage waveform characteristics at temperatures of −40° C., 25° C. and 85° C. respectively. It is obvious from these curves that the characteristic of the induced voltage waveform is sharpened to exhibit a high peak value and a short time between zero-cross points as the temperature decreases, and that the characteristic of the induced voltage waveform is softened to exhibit a low peak value and a long time between zero-cross points as the temperature increases.

Therefore, from these characteristics, the threshold Vref is set in advance so that change of the time T2 in which the induced voltage waveform exceeds the threshold Vref is minimized with respect to temperature change in a specific temperature range. That is, the threshold Vref is set in advance so that time widths $T2_A$, T2B and $T2_C$ in which the induced voltage waveform exceeds the threshold Vref are substantially equal to one another.

In other words, the threshold Vref is set in advance so that change of the number of sampling cycles in which the induced voltage waveform sampled in predetermined sampling timing in a predetermined sampling time exceeds the threshold Vref is minimized with respect to temperature change in a specific temperature range.

When the threshold Vref is set as described above, the time T2 or the number of sampling cycles in which the induced voltage waveform exceeds the threshold Vref can be kept substantially constant even in the case where the value of the induced voltage waveform varies according to temperature change in a specific temperature range. Accordingly, the zero position can be detected accurately without any influence of temperature change.

What is claimed is:

1. A stepper motor driving apparatus, comprising:
    a stepper motor, which includes an excitation coil, and a rotor rotating in accordance with change of excitation state of the excitation coil;
    a driven member, which is interlocked with the rotation of the rotor;
    a stopper operable to mechanically stop the driven member in a zero position;
    a controller operable to control the excitation state of the excitation coil;
    an induced voltage waveform detector operable to detect an induced voltage waveform generated on the basis of change of magnetic flux in accordance with the rotation of the rotor; and
    a zero position detector operable to detect whether the driven member is stopped in the zero position by the stopper, on the basis of the induced voltage waveform detected by the induced voltage waveform detector,
    wherein the zero position detector includes:
        a comparator operable to compare a time T2 in which each induced voltage waveform exceeds a predetermined threshold value with a predetermined contact determining reference time Tref; and
        a determinant operable to determine whether or not the driven member is stopped in the zero position by the stopper based on a result of the comparison by the comparator.

2. The stepper motor driving apparatus as set forth in claim 1, wherein the threshold value is set so that change of the time T2 in which the induced voltage waveform exceeds the predetermined threshold value is minimized with respect to temperature change in a specific temperature range.

3. A stepper motor driving apparatus, comprising:
    a stepper motor, which includes an excitation coil, and a rotor rotating in accordance with change of excitation state of the excitation coil;
    a driven member, which is interlocked with the rotation of the rotor;
    a stopper, operable to mechanically stop the driven member in a zero position;
    a controller operable to control the excitation state of the excitation coil;
    an induced voltage waveform detector operable to detect an induced voltage waveform generated on the basis of change of magnetic flux in accordance with the rotation of the rotor; and
    a zero position detector operable to detect whether the driven member is stopped in the zero position by the stopper or not, on the basis of the induced voltage waveform detected by the induced voltage waveform detector,
    wherein the zero position detector includes:
        a comparator operable to compare the number of sampling cycles in which each induced voltage waveform sampled in predetermined sampling timing in a predetermined sampling time exceeds a predetermined threshold value with a predetermined contact determining reference number; and
        a determinant operable to determine whether or not the driven member is stopped in the zero position by the stopper based on a result of the comparison by the comparator.

4. The stepper motor driving apparatus as set forth in claim 3, wherein the threshold value is set so that change of the number of sampling cycles in which the induced voltage waveform sampled in predetermined sampling timing in a predetermined sampling time exceeds the predetermined threshold value is minimized with respect to temperature change in a specific temperature range.

* * * * *